United States Patent [19]

Aoyama

[11] Patent Number: 4,660,179
[45] Date of Patent: Apr. 21, 1987

[54] SEMICONDUCTOR MEMORY DEVICE WITH SWITCHING FOR REDUNDANT CELLS

[75] Inventor: Keizo Aoyama, Yamato, Japan
[73] Assignee: Fujitsu Limited, Kanagawa, Japan
[21] Appl. No.: 682,515
[22] Filed: Dec. 17, 1984
[30] Foreign Application Priority Data
Dec. 16, 1983 [JP] Japan .................................. 58-238554
[51] Int. Cl.$^4$ ............................................... G11C 7/00
[52] U.S. Cl. .................................................... 365/200
[58] Field of Search .......................... 365/200; 371/10
[56] References Cited
U.S. PATENT DOCUMENTS
4,346,459 8/1982 Sud et al. ............................. 365/200

Primary Examiner—James W. Moffitt
Attorney, Agent, or Firm—Armstrong, Nikaido, Marmelstein & Kubovcik

[57] ABSTRACT

A organization for multi-bit output includes a plurality of memory cell groups and a plurality of data buses, each of which belongs to each of the groups, wherein one of memory cells in each memory cell groups are selected at the same time. A semiconductor memory device includes a plurality of groups of redundant cells one of which can replace a group of memory cells which comprise a defective memory cell, and switching circuits which selectively connect one of the groups of the redundant cells to the data bus belonging to one of the groups of memory cells. The switching circuit can connect the one of groups of the redundant cells to one of the data buses belonging to any of the cell groups.

4 Claims, 9 Drawing Figures

SEMICONDUCTOR MEMORY DEVICE WITH SWITCHING FOR REDUNDANT CELLS

BACKGROUND OF THE INVENTION

1. Field of the Invention

The present invention relates to a semiconductor memory device, in particular, in relates to a semiconductor memory device providing redundant cells.

2. Description of the Related Art

Recently, the capacity of semiconductor memory devices has been and is being greatly increased, and this increase in the capacity of the semiconductor memory device leads to a high probability that some of the memory cells therein will be defective; thus rendering the entire memory defective. To alleviate this problem, there is known a method for providing redundant memory cells and of using these redundant memory cells to replace defective memory cells.

The provision of a large number of redundant cell groups, is useful if a large number of defective memory cells are produced in a cell block. However, where defective memory cells are not produced, the provision of so many redundant cell groups is unnecessary, in that there is no use for them. Thus, usually, only one column or 2 to 3 columns of the redundant cell groups are provided. Further, in the conventional system, the redundant cells groups are linked exclusively to individual cell blocks.

When a redundant cell group is linked to an individual cell block, the following problems arise. That is, assuming that one column of redundant cells is provided for each cell block, and that two defective memory cells linked to a different column are produced in the first cell block but no defective cells are produced in the second cell block. In this case, althrough there are two redundant cell groups and two defective memory cells, the two redundant cell groups are linked to different cell blocks, and therefore, the redundant cell group in the first cell block cannot be used for the second cell block. Thus, only one redundant cell group can be used for replacing the defective cells, and therefore, another defective memory cells cannot be replaced and the functioning of the memory device is deteriorated.

SUMMARY OF THE INVENTION

An object of the present invention is to alleviate the above problems by providing a semiconductor memory device in which the redundant cell groups can be used freely by changing the linking of these cell groups to a particular cell block, and thus enabling a larger number of defective memory cells to be replaced by a smaller number of redundant cell groups.

A characteristic feature of the present invention is that, in a structure for multi-bit output in which a group of memory cells is divided into cell blocks and a plurality of memory cells are selected at the same time by a same address, a semiconductor memory device comprises a plurality of columns of redundant cells which can replace a column of defective memory cells, and switching circuits which selectively connect the output of the column of the redundant cells to a data bus corresponding to each cell block in such a manner that the switching circuits can connect any number of columns of the plurality of columns of redundant cells to data bus corresponding to any cell block.

Further features and advantages of the present invention will be apparent from the ensuing description with reference to the accompanying drawings to which, however, the scope of the invention is in no way limited.

DESCRIPTION OF THE PREFERRED EMBODIMENTS

Figure 1:
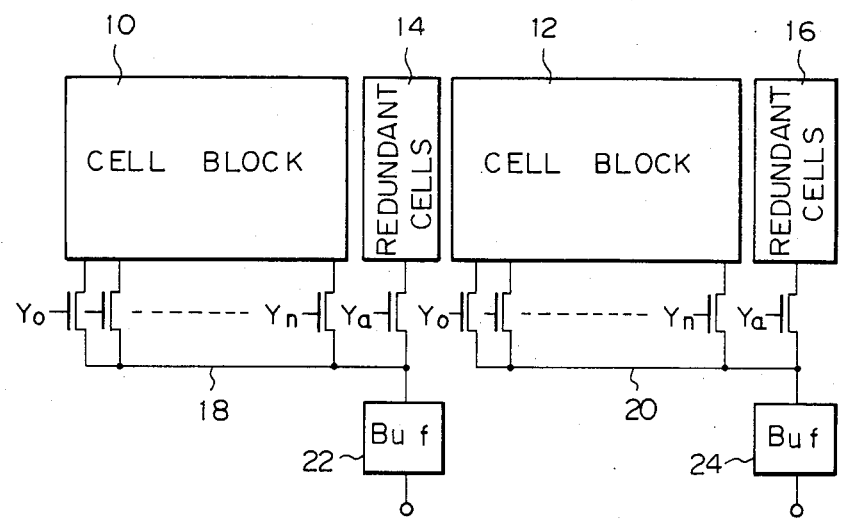
FIG. 1 is a block diagram showing one example of a prior art semiconductor device.

FIG. 1 shows one example of a conventional semiconductor memory device providing redundant cells. In FIG. 1, 10 and 12 represent cell blocks and 14 and 16 redundant cell groups. As is already known, the cell blocks 10 and 12 arrange the memory cells at cross points of many word lines and bit lines (or row lines and column lines), and $Y_o$ to $Y_n$ are signals for selecting the bit lines. The word lines (not shown in the drawing), extend in a horizontal direction, and the redundant cells are provided for each one bit line (1 column) and are selected by a selection signal $Y_a$. Numerals 18 and 20 are data buses and 22 and 24 are I/O (input output) buffers. This memory is constituted by 2 bits, and when memory cells are selected by any address, the corresponding memory cells in cell blocks 10 and 12 are read out, and one bit from each I/O buffer 22 and 24, i.e., a total of two bits, are output at the same time.

Figure 2:
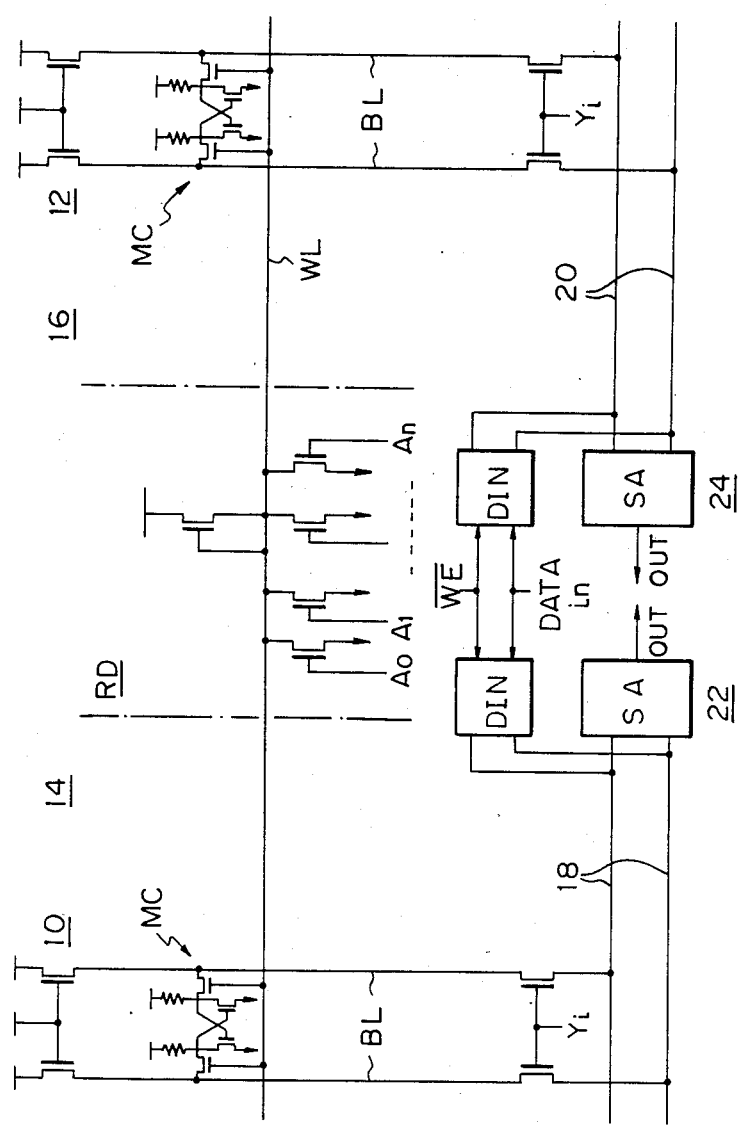
FIG. 2 is a block diagram showing a partially detailed portion of the device shown in FIG. 1.

As the cell blocks and the redundant cell groups are selected by the same address, for simplicity, it is preferable that the word lines are commonly used. FIG. 2 shows such a construction, in which WL shows a word line and BL shows a bit line, each are shown as only one line or as a pair of lines. MC is a memory cell, and in FIG. 2, a static random access memory (SRAM) is shown as an example, wherein the MC is formed by a flip-flop. RD is a row decoder, which receives word line selection address $A_o \sim A_n$ and selects a word line WL when these addresses are at a low (L) level. The word lines WL extends over the cell block 10, the redundant cell groups 14, 16, and the cell block 12, and each word line WL is selected at the same time by the word line address. The I/O buffers include a sense amplifier SA and an input (write) data buffer DIN etc.

These memory devices are tested during manufacture, and when defective cells are found in the cell block, the defective address informations are written in a read-only memory (ROM) (not shown in the drawings). If a defective address is selected while the memory is in use, a column decoder which outputs $Y_o \sim Y_n$ is made noneffective (all outputs of the decoder are made at a low level), and the signal $Y_a$ for selecting redundant cell group is generated. The word lines are common to the cell blocks and redundant cell groups, so that the memory cells on the word lines for the redundant memory cell groups are selected instead of the defective memory cells.

The provision of a large number of redundant cell groups is useful if a large number of defective memory cells are produced in the cell block. However, where defective memory cells are not produced, the provision of so many redundant cell groups is unnecessary, in that there is no use for them. Thus, usually, only one column or 2~3 columns of the redundant cell groups are provided. Further, in the conventional system, the redundant cell groups are linked exclusively to individual cell block. That is, as shown in FIG. 1, the redundant cell group 14 is linked to cell block 10 and the redundant cell group 16 is linked to cell block 12. This is determined by to which data bus the redundant cell group is connected.

When the redundant cell group is linked to the cell block in such a manner, the following problems arise. That is, assuming that one column of the redundant cells is provided for each cell block, and that two defective memory cells linked to different column are produced in cell block 10 but no defective cells are produced in cell block 12. In this case, although there are two redundant cell groups and two defective memory cells, the two redundant cell groups are linked to different cell blocks, and therefore, the redundant cell group 16 cannot be used for cell block 10. Thus, only one redundant cell group 14 can be used for replacing the defective cells, and therefore, another defective memory cells cannot be replaced and the functioning of the memory device is deteriorated.

Figure 3:
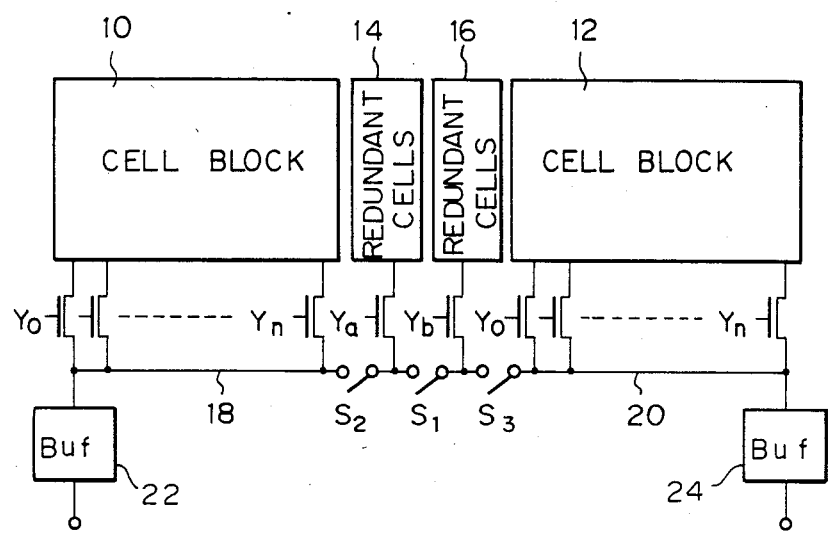
FIG. 3 is a block diagram showing an embodiment of the present invention.

FIG. 3 shows an embodiment of the present invention in which the same elements as in FIG. 1 are designated by the same symbols. As is clear from a comparison of FIGS. 1 and 3, in the present invention, switches $S_1 \sim S_3$ are provided to connect the redundant cell groups 14 and 16 to either of the data buses 18 and 20. Immediately after the memory device is manufactured, the switches $S_1 \sim S_3$ are opened. When no defective memory cell are found in the cell block 10, the redundant cell group 14 is not used, and when the defective memory cell exists in a column in the cell block 10, the switch $S_2$ is closed and the defective memory cell can be replaced by the redundant cell group 14. The same applies to the cell block 12. Up to this point, the device is similar as in the conventional system. However, if two defective memory cells are produced in cell block 10, over two columns and no defective memory cell exists in cell block 12, such a case cannot be handled in the conventional system, but can be dealt with in the present invention, as shown below. That is, when the above feature occurs; the switches $S_1$ and $S_2$ are closed. Therefore, the redundant cell group 16 is linked to cell block 10, so that the defective memory cell belonging to one column of cell block 10 can be replaced by the redundant cell group 14, and the defective memory cell belonging to another column of the memory cell group 10 can be replaced by the redundant cell group 16. Therefore, the functioning of the memory device remains unimpaired.

When the defective memory cells occur in two columns in the cell block 12, and no defective memory cells occur in the cell block 10, switches $S_1$ and $S_3$ are closed. Thus, as mentioned above, the redundant cells replace the defective memory cell, and functioning of the memory device remains unimpaired.

Since the switches $S_1 \sim S_3$ are initially opened, and are closed only when necessary, the switches may be comprised of a poly-crystalline silicon fuse. When the switch is closed, the fuse is melted by supplying a current or by a laser beam. The switches $S_1 \sim S_3$ are initially opened and is closed only when necessary, therefore the structure as shown in FIGS. 4A and 4C may be used.

Figure 4A:
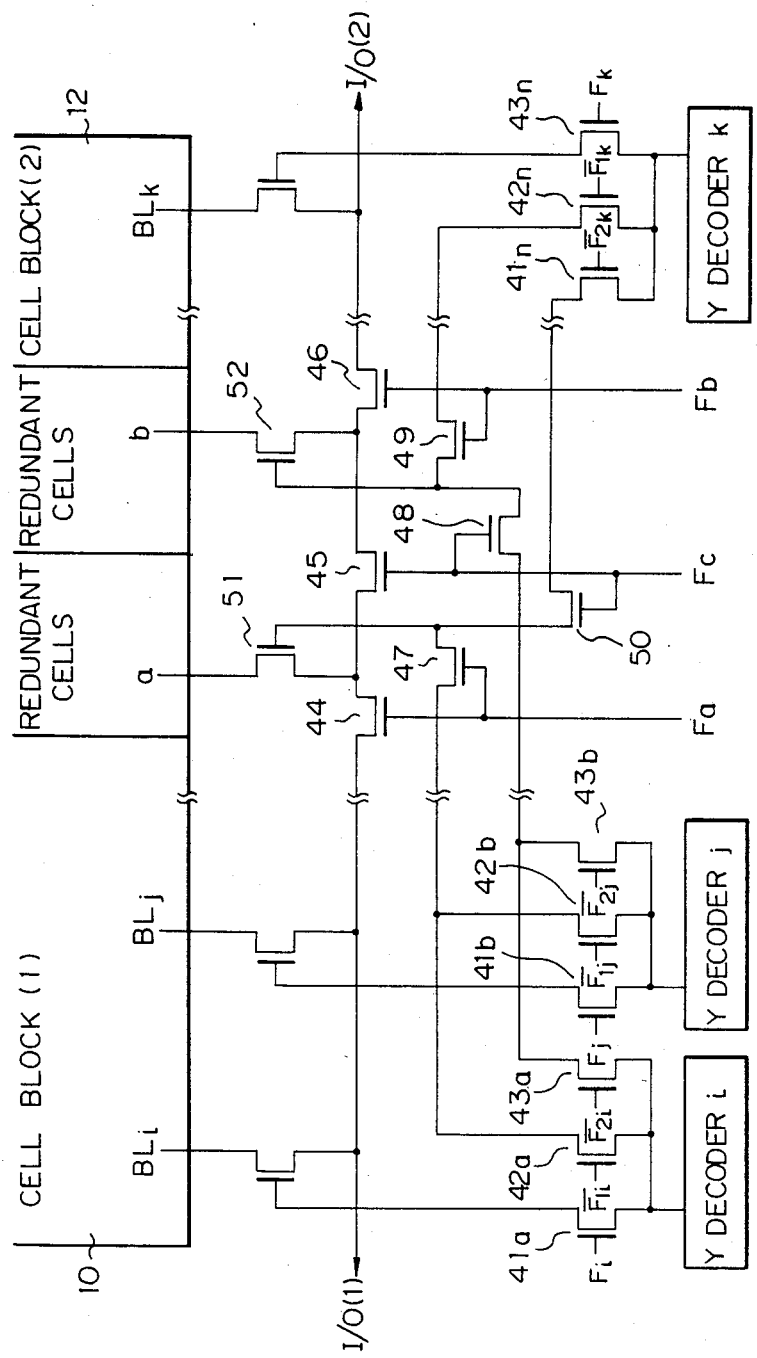
FIGS. 4A, 4B, and 4C are circuit diagrams showing partially detailed portions of the device shown in FIG. 3.

FIG. 4A shows details of the switching circuit shown in FIG. 3. In FIG. 4A, gate transistors 41a, 42a, 43a; 41b, 42b, 43b; ... 41n, 42n, 43n are connected to Y decoders i, j, ... k, respectively, and gate transistors 44, 45 and 46 are connected between I/O inputs (1) and (2). One terminal of each transistor 42a and 42b is connected to the transistor 47, one terminal of each transistor 43a and 43b is connected via transistors 48 and 49 to the transistor 42n, and the transistor 41n is connected to the transistor 50. The transistors 44 and 47 are controlled by an input from a fuse terminal $F_a$, the transistors 46 and 49 are controlled by an input from a fuse terminal $F_b$, and the transistors 45 and 50 are controlled by an input from a fuse terminal $F_c$.

Figure 4B:
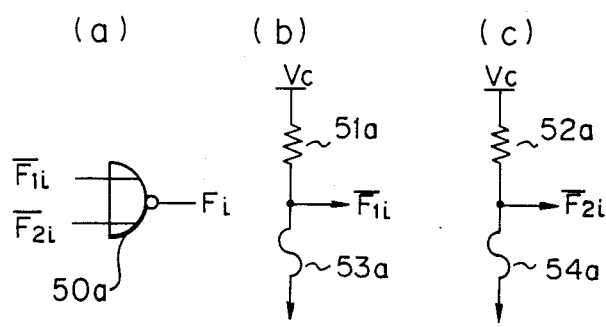
Figure 4C:
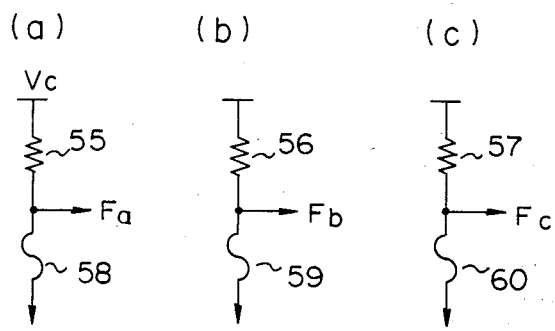

FIG. 4B shows the construction of the fuse (ROM) in each Y decoder wherein, in FIG. 4B, 51a and 52a represent a high resistance, while 53a and 54a represent fuses, and 50a represents a gate circuit which receives the outputs of the fuse shown in (b) and (c) of FIG. 4B. FIG. 4C shows the construction of the fuses ($F_a$, $F_b$, $F_c$) which correspond to the sequences of the redundant cells. In FIG. 4C, 55~57 represent high resistances, and 58~60 represent fuses.

Next, referring to FIGS. 4A, 4B, and 4C, the case in which column i in cell block (1) and column k in cell block (2) are replaced by the redundant cells will be explained. In this case, the fuse 53a corresponding to $\overline{F_{1i}}$(53a) and the fuse 58 corresponding to $F_a$ are melted, so that the sequence of the redundant cell a is replaced by the column i in the cell block (1). Further, the fuse corresponding to $\overline{F_{1k}}$ and the fuse 59 corresponding to $F_b$ are melted, so that the sequence of the redundant cell b is replaced by the column k in the cell block (2).

Next, an explanation will be given for the case in which the columns i and j in the cell block (1) are replaced by the redundant cells. In this case, the fuse 53a corresponding to $\overline{F_{1i}}$(53a) and the fuse 58 corresponding to $F_a$ are melted so that the sequence of the redundant cell a is replaced by the column i in the cell block (1). Further, the fuse corresponding to $\overline{F_{1j}}$ and the fuse 60 corresponding to $F_c$ are melted so that the sequence of the redundant cell b is replaced by the column j in the cell block (1).

In FIGS. 4B and 4C, fuses are made of material such as poly-crystalline silicon, and the transistors are field effect transistors (FETs). In FIGS. 4B and 4C, Fi, $\overline{F_{1i}}$, F2i, $F_a$, $F_b$, $F_c$ are connected to corresponding points of FIG. 4A, and gates of the transistors shown in FIG. 4A are connected, via the fuses 53a, 54a, 58, 59, 60, etc., shown in FIGS. 4B, 4C, to ground. When the fuse F is melted, the transistor is pulled up via the high resistances such as 51a, ..., 55, etc. to the electric source $V_c$, so that it becomes in an ON state. When the fuse F is not melted, the current flows from the electric source $V_c$ via the high resistance and the fuse to ground. However, if the high resistance is used as the resistor R, this current can be decreased to a small value such as in the order of a pico ampere.

Figure 5:
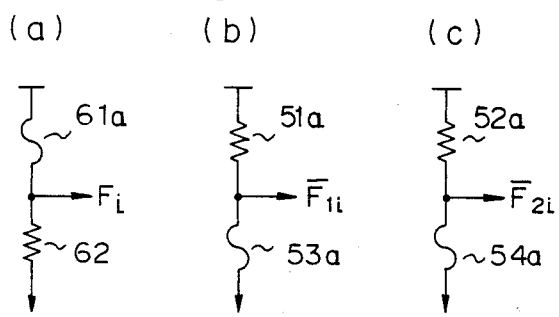
FIG. 5 is another embodiment corresponding to FIG. 4B.

FIG. 5 is another embodiment corresponding to FIG. 4B. In FIG. 4B, if one fuse such as 53a is melted, the signal $F_i$ becomes "L" automatically, so that the transistor 41a is OFF. However, in the embodiment shown in FIG. 5, the structure is such that if at least one fuse corresponding to fuse 53a or 54a is melt, the fuse corresponding to 61a also melts, so that the signal $F_i$ becomes "L" and the transistor 41a is OFF.

Figure 6:
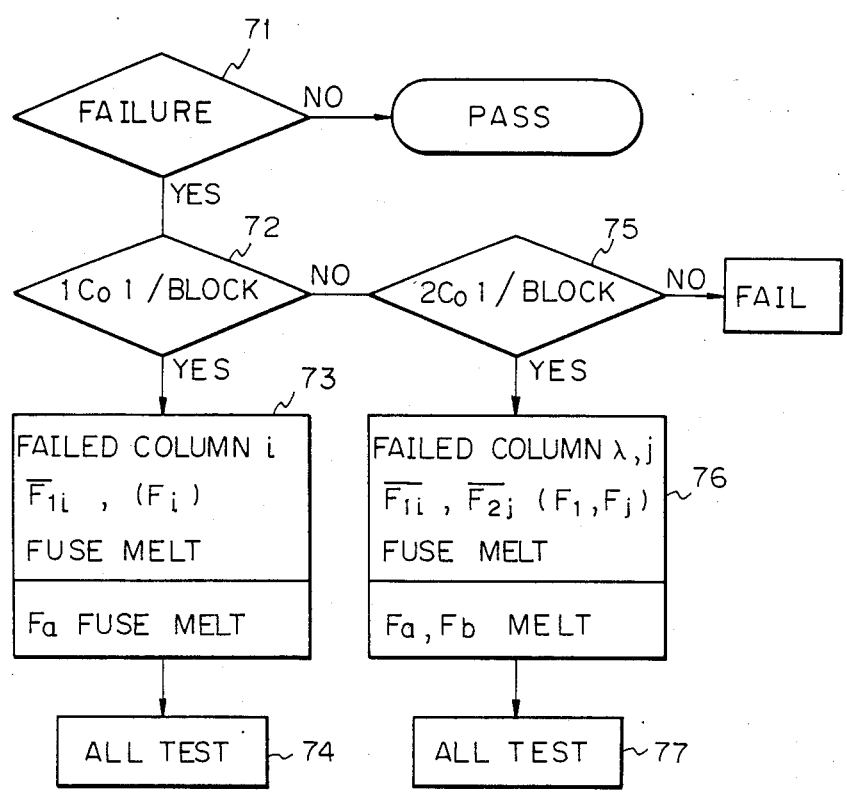
FIG. 6 is a flowchart explaining the operation of the device shown in FIGS. 4A, 4B, and 4C.

FIG. 6 is a flowchart showing the operation of the device shown in FIGS. 4A~4C. In block 71, if a failure is detected, block 71 is transferred to block 72. In block 72, if one column in block 1 is detected, the fuse corresponding to the failed column i and the fuse $F_a$ are melted in block 73, so that the entire device is tested. In block 72, if more than one failed column occurs in block 1, block 72 is transferred to block 75 and the failed columns are examined. When the failed columns are columns i and j in block (1), the fuses corresponding to $\overline{F_{1i}}$, $\overline{F_{1j}}$ ($F_i$, $F_j$), and $F_a$, $F_b$ are melted in the column 76, the failed columns are replaced by the redundant cells, and the entire device is tested.

Figure 7:
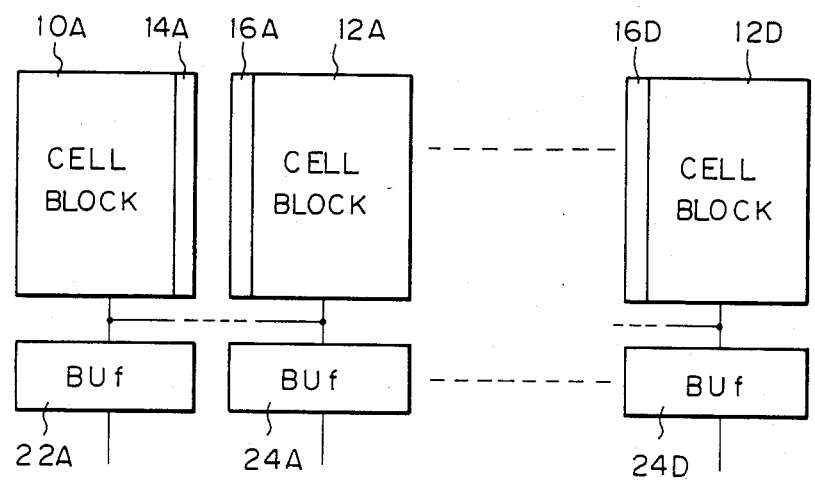
FIG. 7 is a block diagram showing the present invention applied to a memory device having a multi-bit connection.

The memory device includes a one bit organization by which one memory cell is selected by one address, and plurality bit organization by which a plurality of cells are selected at the same time by one address. FIGS. 1 and 3 show a memory having a two bit construction, and a multibit organization such as 8 bits existing in a 64 KRAM. In this case, as shown in FIG. 7, the number of cell block and I/O buffers provided corresponds to the number of bits. In the figures, 10A, 12A, ..., 12D are cell blocks and 22A, 24A, ..., 24D are I/O buffers. In the present example, the four circuits shown in FIG. 2 are provided, so that a 64 KRAM having an 8 K×8 bits organization can be obtained. 14A, 16A, ... 16D are redundant cell groups corresponding to each cell block. In this system, the redundant cell groups 14A and 16A can be connected to the cell blocks 10A or 12A, however, they cannot be connected to another cell block, for example, 12D. For the purpose of improving this point and increasing the connection flexibility of the redundant cell groups to any block, wire connections may be provided along the data buses 18 and 20 for switching the redundant cell groups to another cell block. However, the connection layout then becomes rather complex.

As explained above, in the present invention, the redundant cell groups are not exclusively linked to a cell block but can be connected to any other cell block. Therefore, the present invention can deal with a frequent occurrence of defective memory cells in a cell block without increasing the number of redundant cell groups needed, and thus, the present invention is very effective for carrying out the stated purpose.

What is claimed is:

1. In an organization for multi-bit output which comprises a plurality of memory cell groups and a plurality of data buses, each of which belongs to each of said groups, wherein one of memory cells in each memory cell groups are selected at the same time, a semiconductor memory device comprising;

a plurality of groups of redundant cells one of which can replace a group of memory cells which comprise a defective memory cell;

switching circuits which selectively connect one of said groups of the redundant cells to the data bus belonging to one of said groups of memory cells, so that said switching circuit can connect said one of said groups of said redundant cells to one of said data buses belonging to any of said cell groups; and wherein said switching circuits comprise a first switch which is connected between data buses corresponding to a first group of redundant cells and a second group of redundant cells, a second switch which is connected between data buses corresponding to a first cell block and said first group of redundant cells and a third switch which is connected between data buses corresponding to a second cell block and said second group of redundant cells.

2. The semiconductor memory device according to claim 1, wherein, when the first group of redundant cells is linked to a first cell block, said first switch is opened and said second switch is closed, and when the first group of redundant cells and the second group of redundant cells are linked to said first cell block, said first switch, and said second switch are closed and said third switch is opened.

3. A semiconductor memory device according to claim 2, wherein said first, second and third switches are formed by a field effect transistor, and each of said switching circuits includes a ROM element.

4. A semiconductor memory device according to claim 3, wherein each of said ROM elements includes a series circuit of a high resistance and a fuse formed by poly-crystalline silicon connected between an electric source and ground, and when said fuse is melted, the voltage of said electric source is supplied to a control gate of said field effect transistor so that said field effect transistor is placed in an ON state.

* * * * *